United States Patent [19]
Moreno

[11] Patent Number: 5,933,010
[45] Date of Patent: Aug. 3, 1999

[54] DEVICE TO DETECT CHARGING CONDITION OF A STORAGE BATTERY

[76] Inventor: Gil G. Moreno, 4106 Dellbrook Dr., Tampa, Fla. 33624

[21] Appl. No.: 09/006,620

[22] Filed: Jan. 13, 1998

[51] Int. Cl.[6] .................................................. G01N 27/42
[52] U.S. Cl. ......................... 324/425; 324/433; 324/429; 320/132
[58] Field of Search ........................... 320/132, DIG. 19, 320/DIG. 21; 324/133, 122, 425, 429, 433, 435; 340/648

[56] References Cited

U.S. PATENT DOCUMENTS

| | | |
|---|---|---|
| 3,942,097 | 3/1976 | Itoh . |
| 4,027,231 | 5/1977 | Lorhman . |
| 4,248,942 | 2/1981 | Eby . |
| 4,365,242 | 12/1982 | Morishita . |
| 4,563,629 | 1/1986 | Keiper ........................................ 320/48 |
| 4,719,427 | 1/1988 | Morishita . |
| 4,929,931 | 5/1990 | McCuen . |
| 4,943,777 | 7/1990 | Nakamura . |
| 5,007,867 | 4/1991 | Xuan . |
| 5,130,659 | 7/1992 | Sloan . |
| 5,496,658 | 3/1996 | Hein . |
| 5,519,383 | 5/1996 | De La Rosa ............................. 340/636 |
| 5,614,807 | 3/1997 | Duley . |

FOREIGN PATENT DOCUMENTS

| | | | |
|---|---|---|---|
| 0053469 | 4/1977 | Japan ..................................... | 324/433 |

*Primary Examiner*—Michael L. Gellner
*Assistant Examiner*—Nhung Nguyen

[57] ABSTRACT

This relates to a device consisting of a first plurality of light sources that light only when the voltage of a storage battery in a storage battery-generator system is below a predetermined voltage value, which is between the nominal voltage value of the storage battery and the charging voltage value of the storage battery-generator system, indicating that the battery is not receiving charge. A second plurality of light sources that light only when the voltage of a storage battery in a storage battery-generator system is above a predetermined voltage value, which is between the nominal voltage value of the storage battery and the charging voltage value of the storage battery-generator system, indicating that the battery is receiving charge.

3 Claims, 3 Drawing Sheets

5,933,010

DEVICE TO DETECT CHARGING CONDITION OF A STORAGE BATTERY

BACKGROUND OF THE INVENTION

At present the condition of the electrical system in vehicles with combustion engine is indicated by an electro-mechanical or digital voltmeter. In addition an extra conductor may be run from the generator to an indicating light on the instrument panel. The common vehicular driver cannot make judgment with the indication provided by the voltmeter and therefore is useless for him, it is only an ornament for him.

U.S. Pat. No. 4,027,231 indicates only discharging condition of storage batteries.

U.S. Pat. Nos. 4,943,777; 5,130,659 and 5,496,658 teach devices extremely complex.

SUMMARY OF THE INVENTION

The principal object of the present invention is to provide a device to detect the charging condition of the storage battery on a vehicle with combustion engine economically and effectively by using simple passive electronic components.

It is also an object of the present invention to provide a device to provide indications of simple interpretation.

A further object of the present invention is to provide a device of relatively small size.

Another further object is to provide a device that enhances the safety of vehicle drivers.

All storage batteries have a nominal voltage when is fully charged and is normally called the battery voltage, and is approximately 12.7 volts for common lead-sulfuric acid storage batteries used in automotive vehicles. When a storage battery is being charged, the voltage increases by some value that depends on the generator or charger characteristics. In the common automotive vehicle with combustion engine it is approximately 14 volts. When a battery is being discharged the voltage decreases by some amount relative to the nominal voltage that depends on the rate of discharge.

The present invention provides a plurality of light sources generally green light emitting diodes (LEDs) that turn ON only when the voltage of an storage battery-generator system is above a predetermined value which is between the nominal voltage value and the charging voltage value, indicating that the storage battery is being charged. Another plurality of light sources, generally red blinking LEDs, turn ON only when the voltage of the storage battery-generator system is below a predetermined voltage value which is between the storage battery nominal voltage and the charging voltage value, indicating that the storage battery is not being charged. A continuous indication of the storage battery-generator system condition is therefore provided. Audible signals may be provided. Two simple and economical preferred embodiments using solid state components are used to perform the described operation. In a first preferred embodiment a voltage sensing network and two inverting logic networks are used to energize the plurality of light sources. In a second preferred embodiment a voltage sensing network, a reference voltage network, a voltage divider network, and a voltage comparator network is used to energize the plurality of light sources.

DESCRIPTION OF THE PREFERRED EMBODIMENTS

A First Preferred Embodiment

Figure 1:
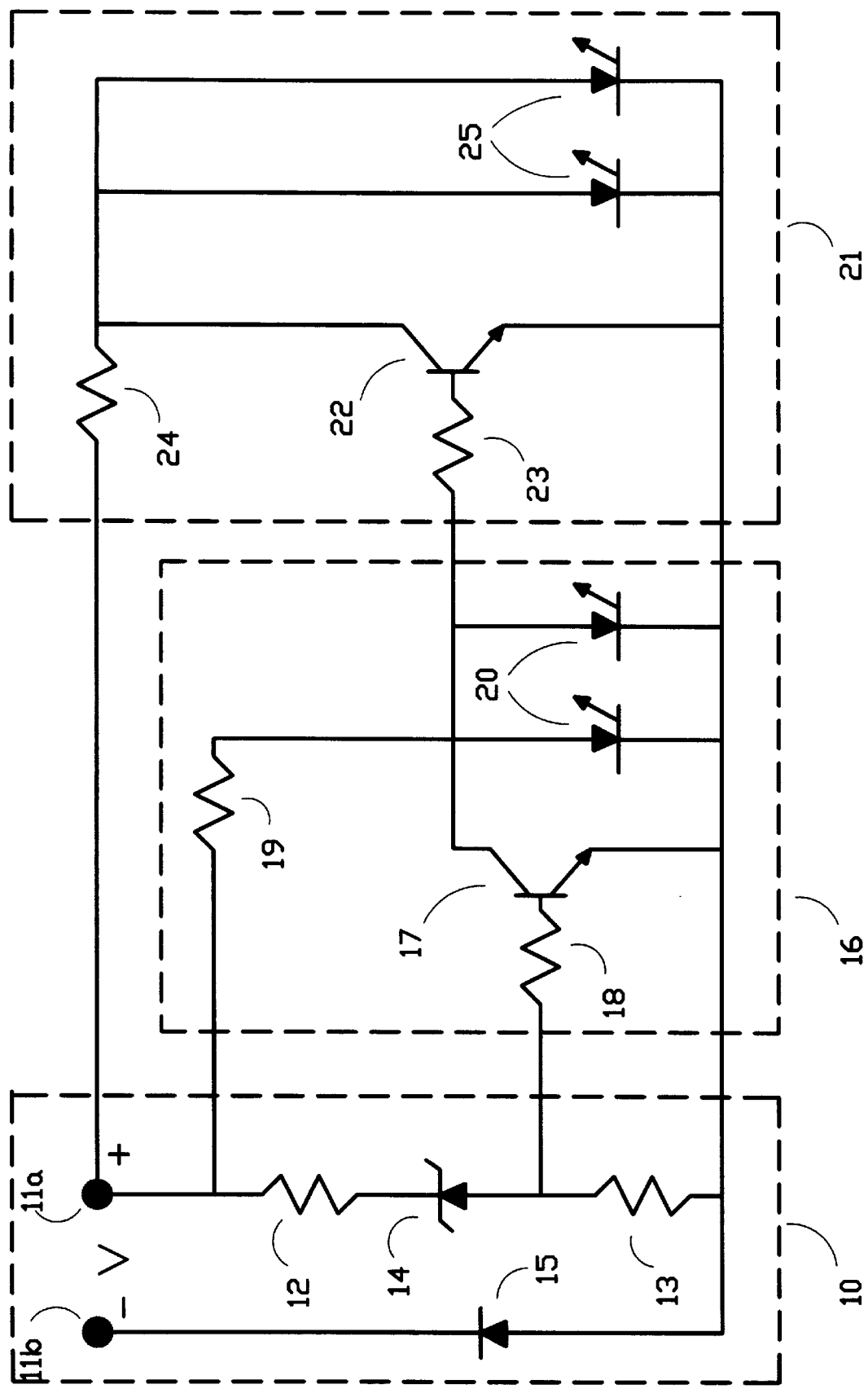
FIG. 1 and FIG. 2 are schematic diagrams of the circuitry of a first and second preferred embodiments to detect condition of a battery in a battery-generator system.
Figure 3:
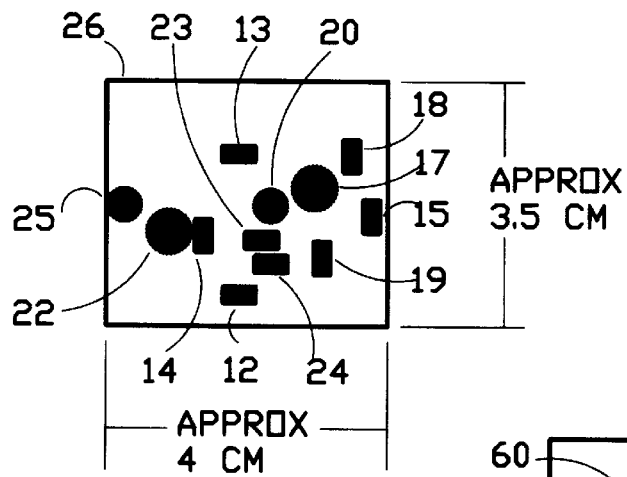
FIG. 3 is a view of a printed circuit board that may be used for the circuitry of a first preferred embodiment.
Figure 5:
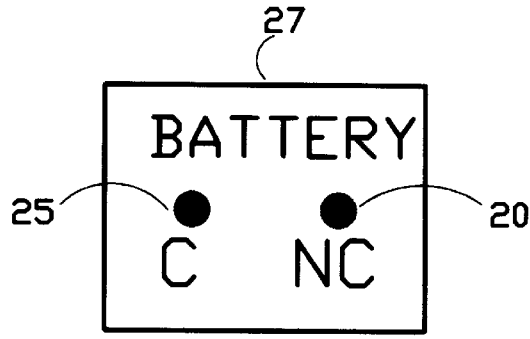
FIG. 5 is a view of a face-plate that may be used with the first preferred embodiment.

Referring to FIG. 1 voltage sensing network 10 consists of terminals 11a and 11b to be coupled to the terminals of a storage battery, resistors 12 and 13, zener diode 14 and diode rectifier 15. First inverting logic network 16 consists of switching transistor 17, resistor 18 coupling said voltage sensing network 10 to the input gate of said first inverting network 16, limiting current resistor 19, and a first plurality of LEDs 20, generally blinking red LEDs, coupled to the output gate of said first inverting network 16. Second inverting logic network 21 consists of switching transistor 22, resistor 23 coupling output gate of said first logic inverting network 16 to input gate of said second logic inverting network 21, limiting current resistor 24 and a second plurality of LEDs 25, generally green LEDs, coupled to output gate of said second inverting logic network 21. Now the operation of the first preferred embodiment will be explained. When voltage V across said terminals 11a and 11b is below a predetermined voltage value which is between the nominal voltage of an storage battery and the charging voltage of the system battery-generator the bias to transistor 17 is low and therefore the output gate of said inverting logic network 16 is high. LEDs 20 will light indicating that the storage battery is not receiving charge. The input gate of said second inverting logic network 21 is high and the output gate of said second inverting logic network 21 is low, LEDs 25 will not light. If voltage V across said terminals 11a and 11b is above the predetermined voltage value, which is between the nominal voltage and the voltage value under charging condition of the storage battery-generator system, bias of said transistor 17 is high and becomes conductive grounding said LEDs 20 and will not light. Bias of said transistor 22 is low, output gate of said inverting network 21 is high and said LEDs 25 will light, indicating that the battery is receiving charge. In FIG. 3 printed circuit board 26 shows an arrangement of the electronic components yielding an approximate dimension of 4 centimeter by 3.5 centimeter. FIG. 5 shows a face-plate 27 with inscriptions that allows the light emitted by said 20 and 27 to be projected outwardly. C is the abbreviation for charging and NC is the abbreviation for not charging.

A Second Preferred Embodiment

Figure 2:
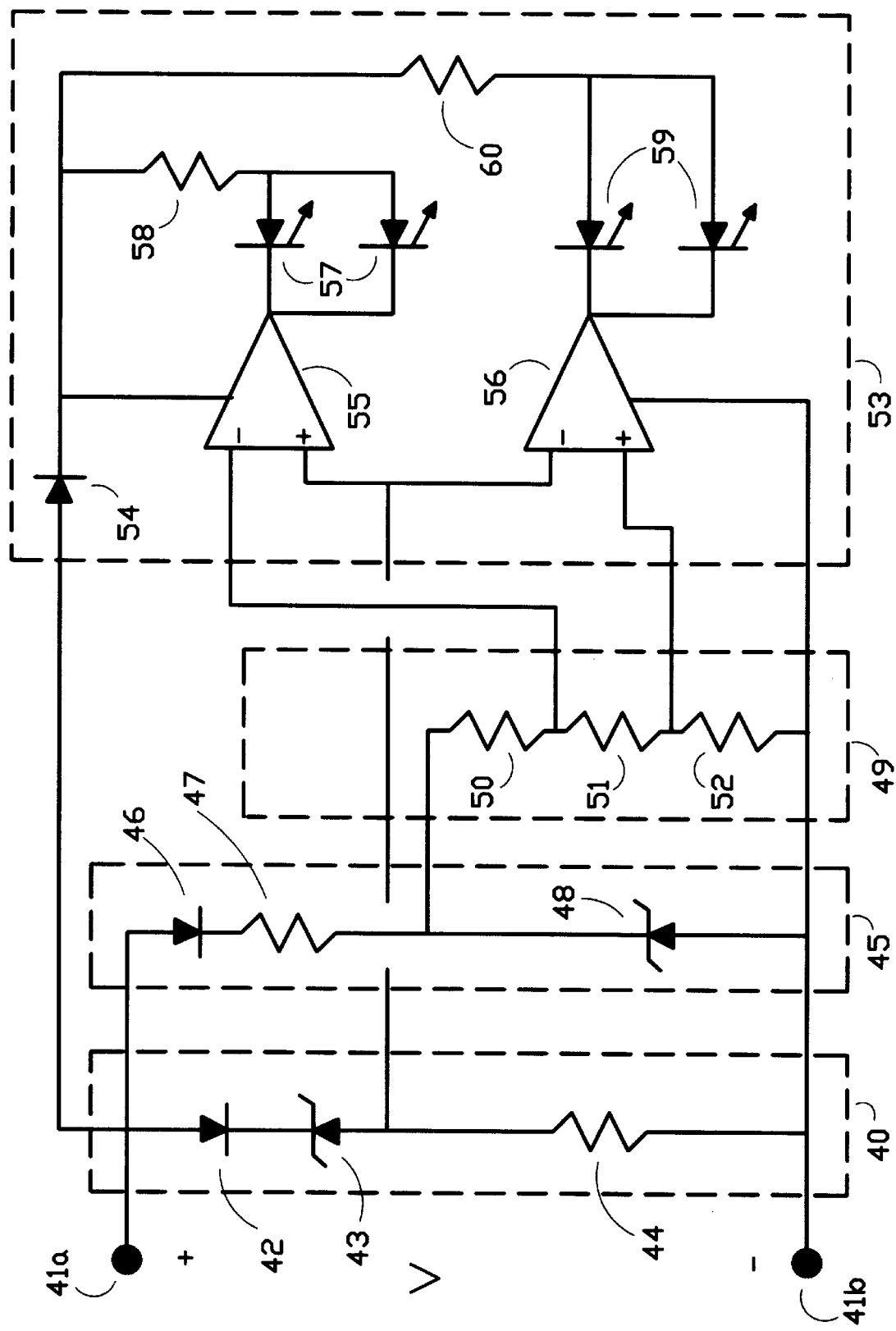
Figure 4:
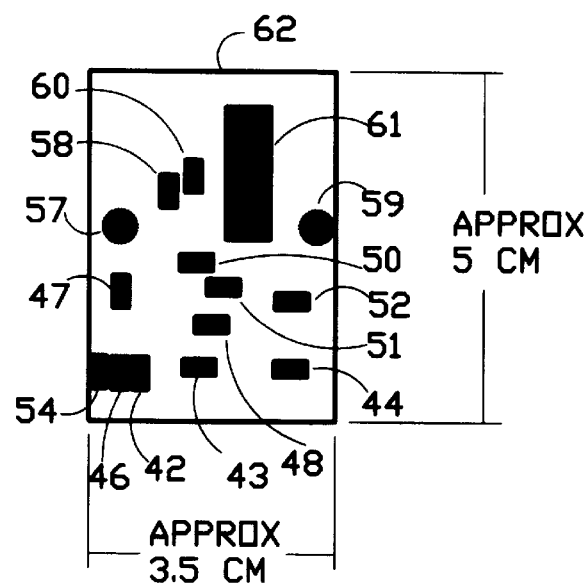
FIG. 4 is a view of a printed circuit board that may be used for the circuitry of the second preferred embodiment.
Figure 6:
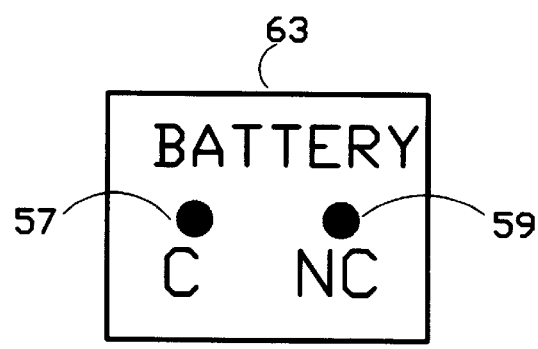
FIG. 6 is a view of a face-plate that may be used with the second preferred embodiment.

Referring to FIG. 2 voltage sensing network 40 consists of terminals 41a and 41b to be coupled to the terminals of a storage battery, diode rectifier 42, zener diode 43 and resistor 44. Voltage reference network 45 consists of diode rectifier 46, resistor 47 and zener diode 48. Voltage divider network 49 consists of resistors 50, 51 and 52. Network comparator 53 consists a first and second voltage comparators 55 and 56, diode rectifier 54, first plurality of light sources 57, second plurality of light sources 59, and limiting current resistors 58 and 60. Negative input of said first voltage comparator 55 is coupled to said voltage divider at a point between said resistors 50 and 51. Positive input of said voltage comparator 55 is coupled to negative input of said second voltage comparator 56 and to said voltage sensing network 40. A first plurality of LEDs 57, generally green LEDs, is coupled to output of first voltage comparator 55 via limiting current resistor 53. Positive input of said second voltage comparator 56 is coupled to said voltage divider network at a point between said resistors 51 and 52. A second plurality of LEDs 59, generally blinking red LEDs, is coupled to the output of said second voltage comparator 56 via limiting current resistor 60. Now the operation of the second preferred embodiment will be explained. When voltage V across said terminals 41a and 41b is above a predetermined value, which is between the nominal voltage value of the storage battery and the charging voltage value of the battery-generator system, the voltage input of said first and second comparator 55 and 56 is greater than the reference voltage, then the output of 55 is high and the output of 56 is low. LEDs 57 will light indicating that the battery is being charged. When the voltage V is below the predetermined value, which is between the nominal voltage value and the charging voltage value of the battery-generator system, the voltage input of 55 and 56 is lesser than the reference voltage, then the output of 55 is low and the output of 56 is high. LEDs 59 will light indicating that the battery is not receiving charge. The voltage reference of said second voltage comparator 56 is slightly lesser than the reference voltage of said comparator 55 to compensate for hysteresis. Operational amplifiers may be used instead of voltage comparators. In FIG. 4 printed circuit board 62 shows an arrangement of the electronic components yielding an approximate dimension of 3.5 centimeter by 5 centimeter. Voltage comparators 55 and 56 are provided by IC 61. FIG. 6 shows a face-plate 63 with inscriptions that allows the light emitted by said 57 and 59 to be projected outwardly. C is the abbreviation for charging and NC is the abbreviation for not charging.

The present disclosure contains that contained in the appended claims as well as that of the foregoing description. Although the invention has been disclosed in its preferred forms with a certain degree of particularity, it is understood that the invention of the preferred form has been made by way of example, that numerous changes in the details of construction and the combination and arrangement of parts may be resorted to without departing from the spirit and scope of the invention.

What is claimed is:

1. A device to detect charging condition of storage batteries comprising in combination:

a voltage sensing network;

a first logic inverting network with its input gate coupled to said voltage sensing network;

a first plurality of light sources coupled to the output gate of said first logic inverting network;

a second logic inverting network with its input gate coupled to the output gate of said first logic inverting network;

a second plurality of light sources coupled to the output gate of said second logic inverting network;

a printed circuit board to contain the electronic components; and a face-plate with inscriptions that allows the light of said light sources to be projected outwardly.

2. A device as set forth in claim 1 wherein, upon coupling said voltage sensing network to a battery, said first plurality of light sources light when the voltage sensed by said voltage sensing network is below a predetermined voltage value which is between the battery nominal voltage value and the charging voltage value of the battery-generator system. This indicates that the battery is not receiving charge.

3. A device as set forth in claim 1 wherein, upon coupling said voltage sensing network to a battery, said second plurality of light sources light when said voltage sensing network senses a voltage above a predetermined voltage value which is between the battery nominal voltage and the charging voltage value of the battery-generator system, this indicates that the battery is receiving charge.

* * * * *